United States Patent
Carberry

(10) Patent No.: US 9,793,461 B2
(45) Date of Patent: Oct. 17, 2017

(54) NANO-STRUCTURED POROUS THERMOELECTRIC GENERATORS

(71) Applicant: Mossey Creek Technologies Inc., Jefferson City, TN (US)

(72) Inventor: John Carberry, Talbott, TN (US)

(73) Assignee: Mossey Creek Technologies, Inc., Jefferson City, TN (US)

(*) Notice: Subject to any disclaimer, the term of this patent is extended or adjusted under 35 U.S.C. 154(b) by 0 days.

(21) Appl. No.: 14/846,297

(22) Filed: Sep. 4, 2015

(65) Prior Publication Data
US 2016/0072033 A1 Mar. 10, 2016

Related U.S. Application Data

(60) Provisional application No. 62/046,434, filed on Sep. 5, 2014.

(51) Int. Cl.
| | |
|---|---|
| *H01L 35/22* | (2006.01) |
| *H01L 35/16* | (2006.01) |
| *H01L 35/20* | (2006.01) |
| *H01L 35/34* | (2006.01) |
| *C04B 35/64* | (2006.01) |
| *C04B 35/65* | (2006.01) |
| *C04B 35/626* | (2006.01) |

(52) U.S. Cl.
CPC .......... *H01L 35/22* (2013.01); *C04B 35/6261* (2013.01); *C04B 35/64* (2013.01); *C04B 35/65* (2013.01); *H01L 35/16* (2013.01); *H01L 35/20* (2013.01); *H01L 35/34* (2013.01)

(58) Field of Classification Search
None
See application file for complete search history.

(56) References Cited

U.S. PATENT DOCUMENTS

| | | | | |
|---|---|---|---|---|
| 3,059,040 | A * | 10/1962 | Schreiner | B22F 3/00 252/62.3 T |
| 3,898,080 | A * | 8/1975 | Penn | H01L 35/22 136/239 |
| 5,767,025 | A * | 6/1998 | Miyake | C01B 21/068 501/92 |
| 7,002,071 | B1 * | 2/2006 | Sadatomi | H01L 35/34 136/236.1 |
| 2008/0202575 | A1 * | 8/2008 | Ren | H01L 35/16 136/201 |
| 2009/0218551 | A1 | 9/2009 | Sengupta et al. | |

(Continued)

OTHER PUBLICATIONS

Xingzhe Wang et al, Effect of Grain Sizes and Shapes on Phonon Thermal Conductivity of Bulk Thermo Electric Materials, American Institute of Physics, Journal Applied Physics 110.

(Continued)

*Primary Examiner* — Katie L. Hammer
(74) *Attorney, Agent, or Firm* — Pitts & Lake, P.C.

(57) ABSTRACT

Methods and processes to fabricate thermoelectric materials and more particularly to methods and processes to fabricate nano-sized doped silicon-based semiconductive materials to use as thermoelectrics in the production of electricity from recovered waste heat. Substantially oxidant-free and doped silicon particulates are fractured and sintered to form a porous nano-sized silicon-based thermoelectric material.

20 Claims, 2 Drawing Sheets

(56) References Cited

U.S. PATENT DOCUMENTS

| | | | |
|---|---|---|---|
| 2010/0051081 A1* | 3/2010 | Iida | B09B 3/005 136/240 |
| 2011/0020164 A1* | 1/2011 | Stefan | C22C 1/0483 419/45 |
| 2012/0152729 A1* | 6/2012 | Teunissen | C23C 14/0623 204/192.25 |
| 2013/0032190 A1* | 2/2013 | Hwang | H01L 35/26 136/238 |
| 2013/0307200 A1 | 11/2013 | Carberry et al. | |

OTHER PUBLICATIONS

John Butt,Thermal Conductivity of Porous Catalysts A.I.CH.E Journal pp. 106 Jan. 1965.

Fang and Pilon, Scaling laws for thermal conductivity of crystalline nanoporous silicon based on molecular dynamics simulations Journal of Applied Physics 110.

K.M. Katika and L. Pilon,The Effect of Nanoparticles on Thermal Conductivity of Nanocomposite Thin Films at Low Temperatures, Journal of Applied Physics, 103(114308).

Lee, Galli and Grossman Nanoporous Si as an Efficient Thermoelectric Material, Nano Lett., 2008, Publication Date (Web): Oct. 23, 2008 American Chemical Society.

Ci et al., Thermoelectric Properties of Silcon Micro-channel Plates Structures, Journal of Physics Conference series 276 (2011).

Kenneth E. Goodson, Novel Materials and Packaging for Thermoelectic Waste-Heat Recovery in Building and Transportation,Mechanical Engineering Department, Standford University.

Jennifer Ni,Eldon Case, Robert Schmidt,The Termal Expansion coefficient as a key design parameter . . . , journal of materials science Sep. 2013 vol. 48 Issue 18 pp. 6233-6244.

H. Julian Goldsmid, Bismuth Telluride and Its alloys as materials for thermoelectric Generation Materials, www.mdpi.com/journal/materials, 2014, 7, 2577-2592.

Mary Smeller, Qiyin Lin, Colby Heideman, New Thermoelectric Materials with Ulta-low Thermal Conductivity,Chemistry Department Materials Science Institute University of Oregon.

L.M. Goncalves, Optimization of thermoelectric properties on Bi2Te3 thin films deposited by thermal co-evaporation TSF-26533.

L.M. Goncalves, Thermoelectric Properties of Bi2Te3 / Sb2Te3 Thin Films, Materials Science Fórum vols. 514-516 (May 2006) pp. 156-160.

Michael R. Zachariah & Michael J. Carrier, Properties of Silicon Nanoparticles: A Molecular Dynamics Study, J. Phys. Chem. 1996, 100, 14856-14864.

Dr. Terry Hendricks and T. Hogan, Advanced Soldier Thermoelectric Power System for Power Generation from Battlefield,Pacific Northwest National Laboratory SERDP SI-1652.

Jing Feng Li,Wei-Shu Liu, Li-Dong Zhao and Min Zhou,High Performance nanostuctured thermoelectric materials,NPG Asia Materials (2010) 2, 152-158.

Simone Dalola, Design and fabrication of a novel MEMS thermoelectric generator, Article in Procedia Engineering (2011).

Gregory P. Meisner, Thermoelectric Conversion of Exhaust Gas Waste Heat into Usable Electricity, 2011 Directions in Engine-Efficiency and Emissions Research Deer Conference.

BCS Inc, Waste Heat Recovery:Technology and Opportunities in U.S. Industry, http://www1.eere.energy.gov/manufacturing/intensiveprocesses/pdfs/waste_heat_recovery.pdf.

M. Hosoda Y. Lee, Size-dependent phonon-limited electron mobility in Si Nanowire MOSFETs,Tokyo Institute of Technology,http://www.iwailab.ep.titech.ac.jp/pdf/201110gcoe/hosoda.

Li Hong Liang, The Size dependent phonon frequency of semiconductor nanocrystals,Institute of Physics Publishing J. Phys.: Condens. Matter 16 (2004) 267-272.

Pin-Hsu Kao, Fabrication and Characterization of CMOS-MEMS Thermoelectric Micro Generators,Sensors (Basel). 2010; 10(2): 1315-1325.Published online Feb. 9, 2010.

Gregory P. Meisner,Skutterudite Thermoelectric Generator for Automotive Waste Heat Rec.,General Motors Global Research & Dev. Mar. 21, 2012 3rd Thermoelectric App.Workshop Baltimore.

Neophytos Neophytou,Numerical study of the thermoelectric power factor in ultra-thin Si nanowires,Article Journal of Computational Elect.Mar. 2012,vol. 11,Issue 1pp. 29-44.

Bed Poudel et al,High-Thermoelectric Performance of Nanostructured Bismuth Antimony Telluride Bulk Alloys,www.scienceexpress.org/20march2008/page4/10.116/science.1156446.

Jie Chen, Universal Gauge for Thermal Conductivity of Silicon Nanowires With Different Cross Sectional Geometries, Dep. of Phys. & Centre for Comp. Science & Eng. Nov. 2011.

Deyu Li,Thermal conductivity of individual silicon nanowires, Applied Phys. lett. vol. 83, #14,Oct. 2003, http://www.me.utexas.edu/~lishi/publication/KSi_APL.pdf.

Gunstein Skomedal,Thermoelectric Materials for Waste Heat Recovery, Review paper as part of ENE601 autumn 2013.

Jian Yang, Thermoelectric Properties of CoSb3 Based Skutterudites, Boston College The Graduate School of Arts and Sciences Department of Physics, Aug. 2012.

Michel Simonin, Key parameters to be considered for market introduction of a Thermoelectric Generator, Transport Research Arena 2014, Paris.

X.W. Wang, Enhanced thermoelectric figure of merit in nanostructured n-type silicon germanium alloy, Applied Physics Letter 93,193121 2008.

Rui-Zhi Zhang,Thermoelectrictransportcoefficientsof n-doped CaTiO3, SrTiO3 and BaTiO3: A theoreticalstudy,Department of Physics, Article in press Physica B.

Serena Margadonna, Temperature-induced abrupt volume inflation in the mixed-valence ternary Zintl phase Yb8Ge3Sb5, Communication www.rsc.org/chemcomm.

Susan M. Kauzlarich, Zintl phases for thermoelectric devices, Perspective www.rsc.org/dalton | Dalton Transactions.

Marina A. Zhuravleva, Intermetallics as Zintl Phases:Yb2Ga4Ge6 and RE3Ga4Ge6(RE=Yb, Eu): Structural Response of a [Ga4Ge6]4 Framework,Chem. Eur. J. DOI: 10.1002/chem.200305755.

Lijun Zhang, Zintl-phase compounds with SnSb4 tetrahedral anions: Electronic structure and thermoelectric properties, Physical Review B 81, 075117 (2010).

R.G. Egbert, Microscale Silicon Thermoelectric Generator with Low Impedance for Energy Harvesting, Department of Electrical Engineering, University of Washington 2010.

Moongyu Jang, The Characteristics of Seebeck Coefficient in Silicon Nanowires Manufactured by CMOS Compatible Process, Nanoscale Res Lett. 2010; 5(10): 1654-1657.

Lei Zuo,NSF-DOE TE Partnership:Integrated Design & Manufacturing of Cost-Effective & Industrial-Scalable TEG for Veh. App. ,2011 DOE ThermoelectricsWorkshop, Jan. 3-6, CA.

Kaz Yazawa, Efficiency, Cost and Weight Trade-off in TE Power Generation System for Vehicle Exhaust Applications, University of California Santa Cruz Jan. 25, 2015.

Jihui Yang, Electrical and Thermal Transport Optimization of HighEfficient n-type Skutterudites, 2011 Thermoelectric Application Workshop Coronado, CA Jan. 4, 2011.

Eric Toberer, Glass-like thermal conductivity in high efficiency thermoelectric materials, Beckman Foundation NASA-JPL ARPA-E DARPA ZT PlusBSST.

Patrick Taylor, Review of Interests and Activites in Thermoelectrics, DoE ThermoelectricsApplications Workshop: Jan. 3-6, 2011.

Francis Stabler, Benefits of Thermoelectric Technology for the Automobile, 2011 DOE Thermoelectric Workshop San Diego, CA.

Emiljana Krali, Seebeck Coefficients in Silicon Nanowire Arrays,Department of Electrical and Electronic Engineering, Imperial College London, South Kensington Campus, UK.

David Nemirand,Scaling Considerations for Thermoelectric Generators, DOE Workshop on Thermoelectrics Jan. 2011.

Andrew Miner,Performance, Market and Manufacturing Constraints relevant to the Industrialization of Thermoelectric Devices, 2011 Thermoelectrics Applications Workshop.

Takenobu Kajikawa, Overview of Progress in R&D for Thermoelectric Power Generation Technologies in Japan, Shonan Institute of Technology Fujisawa, Kanagawa, Japan 2012.

(56) References Cited

OTHER PUBLICATIONS

John Fairbanks,Vehicular Thermoelectrics: A New Green Technology, Thermoelectric Applications Workshop Del Coronado Hotel Coronado, California Jan. 3-8, 2011.
Dr. Andreas Eder, Efficient and Dynamic—The BMW Group Roadmap for the Application of Thermoelectric Generators, Manager Advanced Development BMW EfficientDynamics Jan. 3, 2011.
Gang Chen et al.,Solar Thermoelectric Energy Conversion,2011 Thermoelectrics Application Workshop San Diego, Jan. 3-6, 2011.
CE Vincent, Thermoeconomic Analysis & Design of Domestic Refrigeration Systems, Domestic Use of Energy Conference 2006.
U.S. Department of Energy,Technical Report:Analysis of Amended Energy Conservation Standards for Residential Refrigerator-Freezers Oct. 2005 U.S.
Arun Majumdar,Challenges and Opportunities in Thermoelectric Energy Conversion, Department of Mechanical Engineering University of California, Lawrence Berkeley Lab.
Hendricks et al., Advanced Soldier ThermoelectricPower System for Power Generation from Battlefield Heat Sources,U.S. Department of Energy under Contract DE-AC05-76RL01830.
John Fairbanks,DOE's Launch of High-Efficiency Thermoelectrics Projects,10th Diesel Engine Emissions Reduction Conference San Diego, California Aug. 29-Sep. 2, 2004.
Patent Cooperation Treaty; Int'l Search Report & Written Opinion, Form PCT/ISA/210 (Jan. 2015) Date of Mailing: Dec. 7, 2015.

\* cited by examiner

NANO-STRUCTURED POROUS THERMOELECTRIC GENERATORS

CROSS-REFERENCE TO RELATED APPLICATIONS

This Application claims the benefit of U.S. Provisional Patent Application No. 62/046,434, filed Sep. 5, 2014, the content of which is incorporated by reference herein in its entirety.

STATEMENT REGARDING FEDERALLY SPONSORED RESEARCH OR DEVELOPMENT

Not Applicable

BACKGROUND OF THE INVENTION

1. Field of Invention

The present general inventive concept relates to the preparation and use of thermoelectric materials and more particularly to methods and processes to fabricate doped thermoelectric generators, especially doped silicon-based thermoelectric generators.

2. Description of the Related Art

Semiconductive materials that exhibit the Seebeck and Peltier effects in the presence of a temperature gradient are useful for the production of electricity from waste heat. Semiconductive materials which move heat from one side to the other when presented with an electrical charge from one side to the other are useful for cooling and exhibit the Seebeck effect in the form of the Peltier phenomena. The class of semiconductive materials exhibiting the Seebeck and Peltier effect is hereinafter called thermoelectrics or thermoelectric materials.

A number of contemporary thermoelectrics comprise alternating P-type and N-type semiconductor elements connected by metallic connectors. Many contemporary thermoelectrics present various disadvantages, including, in some instances, high material costs, high costs of production, difficulty of manufacture, the use of rare elements, the use of potentially carcinogenic or toxic substances, and limited formability.

To achieve a high level of conversion, both a high thermoelectric figure-of-merit (ZT) and a high operating temperature are required.

The Seebeck Coefficient (S) of a material is a measurement of the magnitude of an induced thermoelectric voltage in response to a temperature difference across that material. Optimally, a highly efficient thermoelectric material should have a high Seebeck Coefficient, high electrical conductivity, and low thermal conductivity and be able to operate at high temperatures, meaning it should have a low coefficient of thermal expansion. See, e.g., Ci et al., *Materials Letters* 65, 1618-1620 (2011). Other considerations arise as well. For instance in order to sustain a high temperature difference from one side to the other a low coefficient of thermal expansion, low Poisson ratio and high strength are desirable. It is desirable that a thermoelectric material be susceptible to being worked to construct planar and complex net-shaped objects that can be fitted into locations where they may be used to recover waste heat. Such a thermoelectric material should have a cross section with properties to maintain a sufficiently high temperature differential between the two opposing sides in order to generate voltage efficiently. It is also desirable that a thermoelectric material have high tensile strength, have resistance to thermal shock, and be formable into layers to allow the creation of graded indices for electrical, thermal, or other parameters—allowing one thermoelectric material to serve as the basis for a range of thermoelectric devices.

The thermoelectric figure-of-merit, ZT, for a thermoelectric material (TEMat) is a measure of its efficiency. Z is calculated by multiplying electrical conductivity (s) and Seebeck Coefficient (S) squared and dividing by thermal conductivity (k), or $Z=S^2\sigma/k$, and ZT is calculated by multiplying Z with absolute temperature (in Kelvin). To achieve a high power factor, it is therefore desirable to have a TEMat with low thermal conductivity, high electrical conductivity, high Seebeck Coefficient, and with a high temperature operating capability (i.e., a sustainable temperature difference across its structure or DT capability).

But potentially exploiting a TEMat's ZT is more than materials science. Successful exploitation will need to combine brittle material engineering practices as TEMats, as a material class, are very brittle (i.e., low fracture toughness). A prerequisite to exploiting a TEMat high temperature capability and its ZT is it must be able to also mechanically withstand a large DT in service. This in turn results in a need for the TEMat to have a minimum coefficient of thermal expansion (CTE) and maximum tensile strength (STen). Lastly, from a perspective of size, a larger TEMat component or "leg" will promote the ability to achieve a larger DT (presuming it does not mechanically fail); this is an important issue for achieving cold temperatures too.

Incumbent technologies offer little hope of making low cost thick structures able to operate at high temperatures with high unaided DT and attractive power factors. Traditional and new approaches to making thermoelectric generators (TEGs) are all flawed by fundamental and seemingly intractable challenges, such as high cost, high CTE, limited to thin planer structures, low S, low electrical conductivity, low mechanical strength, or use of rare and costly materials, or combinations thereof. Many of those same issues limit the ability to achieve colder temperatures with thermoelectric coolers (TECs).

Also, thermoelectric materials, as a material class, are very brittle. Therefore, it is also desirable to be able to fashion a thermoelectric material with reduced brittleness.

An ideal pathway for making thermoelectric devices would include a way to obtain nano sized equiaxed silicon grains that could be formed into robust large shapes with large cross sections and a nano structured morphology, so to achieve or promote a low CTE, a low value for k, very high values for s, gain high S values, and high operating temperature capability.

Many of the recent efforts and developments in this field have focused on nanowires and MEMS, which have brought forward announcements confirming exceptionally high power factors with very high efficiencies in converting waste heat to electricity. Unfortunately, these structures are expensive and cannot be practically made in the thick cross sections required to maintain a large unaided or largely unaided ΔT. Many of the results reported used aggressive heat exchange apparatus to maintain a high ΔT. In many or most cases, these aggressive heat exchange apparatus are also necessary to limit the ΔT in order to avoid catastrophic thermomechanical failure of the thermoelectric materials.

Some thermoelectric generators employ compounds and elements such as tellurium or rare earth metals—many of which are scarce, sourced from only a few locations. For operators working in North America, many such materials must be imported (for example, most rare earth metals at this time are imported from China). It is desirable to have a thermoelectric material that does not require tellurium, rare earth metals, and similarly rare component materials.

Wang et al. ("Effect of Grain Sizes and Shapes on Phonon Thermal Conductivity of Bulk Thermo Electric Materials," *Journal of Applied Physics* 110, 024312 [2011]) teach that silicon's thermal conductivity is insensitive to grain size until the grain sizes are reduced to quite a bit less than a micron, and then falls precipitously from about 600 nm to 5 nm with thermal conductivity falling to less than 0.4 W/mK. But they only address a "bulk" material. They do not describe methods or sources for a silicon bulk material with a grain size in the range of a few or tens of nanometers, but conclude that only by reducing the grain size can one obtain silicon with very low thermal conductivity.

U.S. Pat. No. 8,334,194, issued to Jonczyk and Rand, discloses methods and apparatus for fabricating a semiconductor sheet. In one aspect, a method for fabricating a semiconductor wafer includes applying a layer of semiconductor material across a portion of a setter material, introducing the setter material and the semiconductor material to a predetermined thermal gradient to form a melt, wherein the thermal gradient includes a predetermined nucleation and growth region, and forming at least one local cold spot in the nucleation and growth region to facilitate inducing crystal nucleation at the at least one desired location.

U.S. Pat. No. 9,011,763, issued to Chen et al., discloses nanocomposite thermoelectric materials that exhibit enhanced thermoelectric properties. The nanocomposite materials include two or more components, with at least one of the components forming nano-sized structures within the composite material. The components are chosen such that thermal conductivity of the composite is decreased without substantially diminishing the composite's electrical conductivity. Suitable component materials exhibit similar electronic band structures. For example, a band-edge gap between at least one of a conduction band or a valence band of one component material and a corresponding band of the other component material at interfaces between the components can be less than about $5k_BT$, wherein $k_B$ is the Boltzman constant and T is an average temperature of said nanocomposite composition.

BRIEF SUMMARY OF THE INVENTION

Silicon has a high Seebeck Coefficient, a high capability to work at a range of temperatures, and the ability to be tailored as a semiconductor. U.S. Pat. No. 6,638,491 teaches a safe and economical method for nano-sizing silicon safely and economically. What is needed is a silicon-based material with a low thermal conductivity.

Disclosed herein are methods and processes to fabricate thermoelectric materials and more particularly methods and processes to fabricate doped silicon-based semiconductive materials to use as thermoelectrics in the production of electricity from recovered waste heat.

The challenge of making a very effective thermoelectric device (for generating electricity or for cooling by the Seebeck and Peltier effects, respectively) with silicon depends upon several variables that relate to optimization per the Seebeck equation. In various example embodiments of the present general inventive concept, fabrication of these effective silicon-based thermoelectric devices involves: doping for high electrical conductivity for both P-type and N-type by doping from column III and column V of the periodic chart respectively, as is done for semiconductor applications; doping within the discipline of otherwise very high purity to maintain high values for the Seebeck Coefficient; utilizing the ability to manipulate silicon at very high temperatures; and reducing the thermal conductivity by exploiting the quantum size effect for blocking phonons while maintaining high electrical conductivity. The present general inventive concept accomplishes all of this with a porous silicon structure constructed with nano-sized grains which are constructed with electronic grade silicon, pre-doped to desired high electrical conductivity and then mechanically fractured in a controlled process to preclude oxidation and contamination and then recombined in a porous structure by pressing these nano grains into a preform and sintering at a temperature below the melting point of bulk silicon but above the temperature where the glassy state evolves and surface melting causes a fusion or melting together, in effect fusing or bonding the crystalline structures together in such a way that the contacts are large enough (more than 5 nanometers) to provide a Fermi wave vector that keeps the electrical conductivity within Ohms Law and sustain high electrical conductivity, but small enough (less than 200 nanometers) to preclude conduction of the phonon.

In various example embodiments, methods and processes according to the present general inventive concept involve processing suitable silicon precursors into nano-sized grains, essentially equiaxed, which can be formed into large net shape simple or complex thick shapes and sintered into structures containing these nano structured morphologies while containing dopants, for instance boron, that provide high electrical conductivity and a high Seebeck Coefficient in such a way as to preserve high carrier concentrations and long carrier lifetime. An element for success is protecting the silicon surfaces before and during sintering from any oxidation as a small amount of oxidation in these very small grain boundaries can cause very large increases in electrical resistivity.

In some example embodiments of the present general inventive concept, a method for fabricating a doped silicon-based thermoelectric material encompasses introducing a first quantity of silicon particulates into an attrition mill in the absence of oxidants, subjecting said silicon particulates to attrition in the attrition mill for a time sufficient to reduce at least a portion of said silicon particulates to a preselected average particle size to produce a second quantity of reduced particle size silicon particulates being essentially oxidant free, said second quantity of reduced particle size silicon particulates having a median size of less than 3,000 nanometers, said second quantity of reduced particle size silicon particulates having substantially equiaxed grain particles, withdrawing from said attrition mill at least a portion of said second quantity of reduced particle size silicon particulates, admixing the withdrawn reduced particle size silicon particulates with a dopant to affect the semiconductive properties of the thermoelectric material, fracturing the doped silicon particulates in the absence of oxidants; pressing the doped silicon particulates into a preform; and sintering doped silicon particulates in the absence of oxidants to form a doped silicon-based thermoelectric material.

In some embodiments, said dopant includes boron or other P-type dopants.

In some embodiments, said dopant includes phosphorous or arsenic or other N-type dopants.

In some embodiments, said dopant includes germanium or other enhancements for silicon's performance.

In some embodiments, said dopant includes an element selected from the group consisting of selenium, tellurium, germanium, tungsten, boron, and phosphorus.

In some embodiments, said sintering is carried out in an inert atmosphere.

In some embodiments, said sintering is carried out under reduced pressure.

In some embodiments, said sintering is carried out at a temperature of between 1000 degrees Celsius and 1414 degrees Celsius.

In some embodiments, said sintering is carried out at a temperature of at least 1150 degrees Celsius.

In some example embodiments of the present general inventive concept, a doped silicon-based thermoelectric material includes milled silicon grain particles having a median particle size of less than 3,000 nanometers, said milled silicon particles being substantially equiaxed, and a dopant mixed with milled silicon particles to form a doped silicon-containing material, said dopant reducing the thermal conductivity of the doped silicon-containing material compared to the milled silicon grain particles, said doped silicon-containing material being sintered in the absence of oxidants to form a doped silicon-based thermoelectric material.

In some embodiments, said dopant includes boron or other P-type dopants.

In some embodiments, said dopant includes phosphorous or arsenic or other N-type dopants.

In some embodiments, said dopant includes germanium or other enhancements for silicon's performance.

In some embodiments, said dopant includes an element selected from the group consisting of selenium, tellurium, germanium, tungsten, boron, and phosphorus.

In some embodiments, the sintering is carried out in an inert atmosphere.

In some embodiments, the sintering is carried out under reduced pressure.

In some example embodiments of the present general inventive concept, a process for fabricating a doped silicon-based thermoelectric material includes providing an initial feedstock of silicon particulates; mixing the silicon particulates with a dopant; milling the silicon particulates and dopant so that said silicon particulates have a median size of less than 3,000 nanometers and are substantially equiaxed; and sintering recovered silicon particulates and dopant to form a doped silicon-based thermoelectric material.

In some embodiments, said dopant includes an element selected from the group consisting of selenium, tellurium, germanium, tungsten, boron, phosphorus, and arsenic.

In some embodiments, said dopant includes boron or other P-type dopants.

In some embodiments, said dopant includes phosphorous or arsenic or other N-type dopants.

In some embodiments, said dopant includes germanium or other enhancements for silicon's performance.

In some embodiments, said sintering is carried out in an inert atmosphere.

In some embodiments, said sintering is carried out under reduced pressure.

In another example embodiment of the present invention, a process for fabricating a silicon-based thermoelectric material involves providing an initial feedstock of silicon particulates; mixing the silicon particulates with a dopant; milling the silicon particulates and dopant so that said silicon particulates have a median size of less than 3,000 nanometers and are substantially equiaxed; and sintering recovered silicon particulates and dopant to form a doped silicon-based thermoelectric material.

In several example embodiments, the final product is a silicon-based thermoelectric material comprising a heterogeneous mixture of silicon particulates, substantially free of oxidants, with a dopant added to affect the semiconductive properties of the thermoelectric material, the heterogeneous mixture having been sintered to form a polycrystalline silicon-based thermoelectric material. In some example embodiments, the thermoelectric material includes at least two layers having different thermoelectric properties.

In some of the several embodiments, the present invention allows for the fabrication of planar, net-shaped, or complexly shaped thermoelectric devices that are capable of being installed in a variety of places, and in particular are capable of being installed in places to absorb waste heat from machinery or equipment and transform the waste heat into electricity. For example, thermoelectric devices according to some of the example embodiments of the present invention are capable of being wrapped around pipes in some industrial settings, absorbing heat from the pipe.

BRIEF DESCRIPTION OF THE SEVERAL VIEWS OF THE DRAWINGS

The above-mentioned features and other aspects of the invention will become more clearly understood from the following detailed description of the invention read together with the drawings in which.

DETAILED DESCRIPTION OF THE INVENTION

Figure 1:
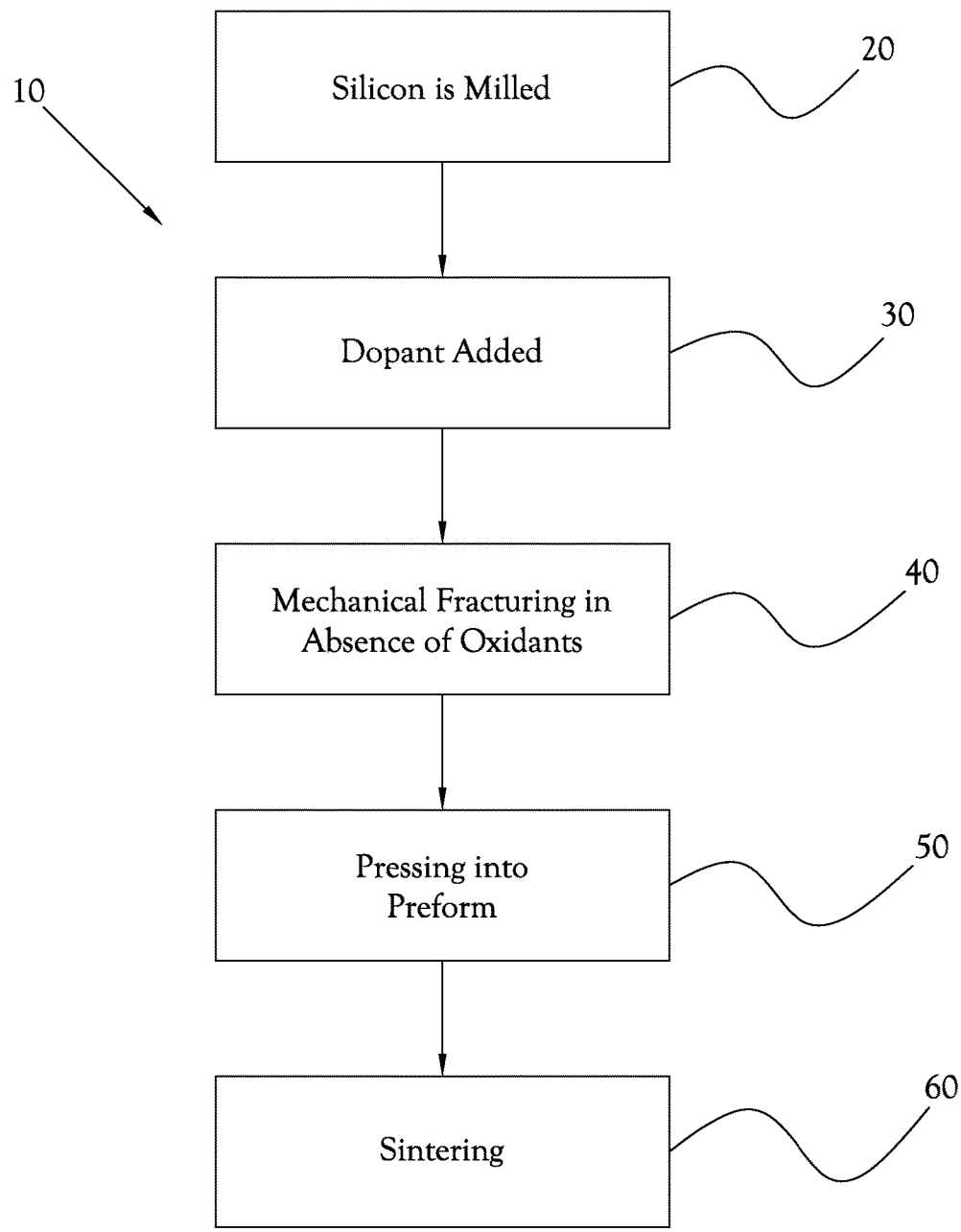
FIG. 1 is a flow diagram of an example embodiment of a method for fabricating a doped silicon-based thermoelectric material.

Disclosed herein are methods and processes to fabricate thermoelectric materials and more particularly to methods and processes to fabricate doped silicon-based semiconductive materials to use as thermoelectrics in the production of electricity from recovered waste heat. In some example embodiments, the present invention comprises a thermoelectric material that incorporates a silicon-based semiconductor material.

Also disclosed herein are methods and processes that encompass the use a high-purity, properly-doped, nanostructured, porous silicon milled to a particle size less than a few microns, and sinter into a thick structure that will achieve a very high efficiency converting heat to electricity.

In various example embodiments of the present general inventive concept, fabrication of effective silicon-based thermoelectric devices involves: doping for high electrical conductivity for both P and N type by doping from column III and column V of the periodic chart respectively, as is done for semiconductor applications; doping within the discipline of otherwise very high purity to maintain high values for the Seebeck Coefficient; utilizing the ability to manipulate silicon at very high temperatures; and reducing the thermal conductivity by exploiting the quantum size effect for blocking phonons while maintaining high electrical conductivity.

The present general inventive concept, in various embodiments, accomplishes all of this with a porous silicon structure constructed with nano-sized grains which are constructed with electronic grade silicon, pre-doped to desired high electrical conductivity and then mechanically fractured in a controlled process to preclude oxidation and contamination and then recombined in a porous structure by pressing these nano grains into a preform and sintering at a temperature below the melting point of bulk silicon but above the temperature where the glassy state evolves and surface melting causes a fusion or melting together, in effect fusing or bonding the crystalline structures together.

Examples of the present general inventive concept encompass approaches that provide high operating temperature, long term temperature stability, required low costs, available materials, thick cross section to support large $\Delta T$ (i.e., difference between maximum and minimum temperatures associated with a temperature gradient, low coefficient of thermal expansion (CTE) to support the large $\Delta T$, high Seebeck Coefficient, and low thermal conductivity.

It is desirable to have a thermoelectric material with low thermal conductivity, high electrical conductivity, and high Seebeck Coefficient. Through methods and processes according to the present general inventive concept, it is further possible to produce thermoelectric materials with high temperature operating capability (i.e., a sustainable temperature difference across its structure or $\Delta T$ capability) with a very low coefficient of thermal expansion (CTE).

A prerequisite to exploiting a thermoelectric material high temperature capability and its ZT is it must be able to also mechanically withstand a large, mostly unaided $\Delta T$ in service. This in turn results in a need for the Thermoelectric material to have a minimum CTE and maximum tensile strength (STen), and those are particularly crucial to minimize thermal shock susceptibility given Thermoelectric materials have a desirably low (which compromises that same susceptibility).

A larger thermoelectric material component or "leg" will promote the ability to achieve a larger unaided $\Delta T$ (requiring it does not mechanically fail due to low strength and high CTE); this is an important issue for achieving cold temperatures too. Later we will address the potential to refine this equation by adding to the denominator dimensions that will portray the thermal gradient of the system.

Generally, in many example embodiments of the present general inventive concept, it is desirable for a Seebeck or Peltier device to exhibit the following characteristics: a minimum efficiency of 15% is required for a $\Delta T$ of 673 K (400° C.), meaning an operating temperature of at least 773 K (500 C); a limit with regard to CTE of about 6×10-6/° C. (or 6 ppm/° C.); a Seebeck Coefficient of 220 µV/K, which when squared is 0.0000000484 V2/K2; electrical conductivity of at least 30,000 Siemens (which adjusts the previous value up to 0.001452 SV2/K2); and at minimum a ZT of 1, and preferably at least 1.0164.

Silicon has a very low CTE, a high Seebeck Coefficient, and the ability to be tailored for specific semiconductor and electrical and thermoelectric properties. Silicon-based devices can be economically manufactured in large volumes from abundant materials, and they can be made at required very high purity levels economically. Silicon can be engineered into systems that can operate at high temperatures. The key issues for success for silicon in this most valuable application is its high thermal conductivity of 149 W/mK.

Proper nano structuring can provide a means to tailor silicon structures for exceptionally low thermal conductivity, as low as 0.4 W/mK, a 350 times reduction in this denominator in the thermo electric power factor equation which has, until now, disqualified silicon in this application.

Examples of the present general inventive concept encompass approaches for making thermoelectric devices that include a way to obtain porous, nano-sized, equiaxed silicon grains that could be formed into robust large shapes with large cross sections and a nano structured morphology, so to achieve or promote a low CTE, a low value for thermal conductivity, very high values for electrical conductivity, high S values, and high operating temperature capability.

Generally speaking, various example embodiments of the present general inventive concept involve the use of phonon interference to decouple the phonon of the thermoelectric material from the electron flow within said same thermoelectric material. In various example embodiments, this process includes: economically milling silicon to nano-sized equiaxed grains without substantial contamination; doping the silicon grains with boron, phosphorus, or similar materials, thereby creating a doped material with high electrical conductivity without increasing thermal conductivity; sintering the doped material, meanwhile protecting the nano-sized equiaxed grains of silicon from oxidation between the milling step and the sintering step; and forming the thermoelectric material into porous, strong, large, complex shapes, generally exhibiting high ZT.

By doping finely milled silicon with materials such as boron, phosphorous and arsenic among many others, it is possible to dramatically increase the electrical conductivity of the resulting doped thermoelectric material, while at the same time reducing and managing the thermal conductivity of the material. In this case, the phonon is not able to efficiently pass through the barrier at the interface, while the electron passes with little or no resistance or interference. This permits doping of the silicon to increase electrical conductivity without increasing the thermal conductivity, essentially decoupling of the duality of the electron and phonon terms. This decoupling is a quantum size effect.

In various example embodiments, methods and processes according to the present general inventive concept involve processing suitable silicon precursors into nano sized grains, essentially equiaxed, which can be formed into large net shape simple or complex thick shapes and sintered into structures containing these nano structured morphologies while containing dopants, for instance boron, that provide high electrical conductivity and a high Seebeck Coefficient in such a way as to preserve high carrier concentrations and long carrier lifetime. An element for success is protecting the silicon surfaces before and during sintering from any oxidation as a small amount of oxidation in these very small grain boundaries can cause very large increases in electrical resistivity.

Small nano structure morphology in silicon, where the interfaces are in the range of a few to tens of nm, between small structures of milled silicon grains (e.g., wires, micropores, MEMs structures) have phonon interference at the grain boundaries without interference with electrical conduction. This permits lowering silicon's otherwise high thermal conductivity without concomitantly reducing its electrical conductivity. Simultaneously, doping with boron promotes high electrical conductivity. It is also possible to prepare silicon alloyed with other materials, for instance germanium (typically in the range of 20% germanium and 80% silicon) which aids milling by increasing brittleness, and makes a porous structure of alloyed and doped silicon alloyed with germanium, thus increasing temperature operating range and increasing the power factor.

Some example embodiments of the present general inventive concept include sintering the particles in a manner much like the process for making rebonded fused silica. In the case of fusing ground particles of fused silica, relatively pure glass sand (Fe about 350 ppm, total 350 ppm impurities) is heated in the presence of oxygen at a temperature in excess of 2103 K (1830° C.). It is then ground into powder, milled in water to make a slip, slip cast or otherwise prepared into a shape and then fired at about 1373 K (1100° C.), degrees less than its melting point. In this process there are bonds permanently formed at the surface interface of the glass particles. Typical density is about 1.9 grams/cc, about 81% of theoretical density.

The glass of course has a well characterized glass transition profile, but the idea of that the surface of silicon might behave as the amorphous variant, and exhibit low temperature glass transition temperature is a relatively new idea.

We have already milled silicon in alcohol to sizes in the range of a D 50 between 300 nm and 12 microns and pressed these under pressure of 10 to 1000 MPa into 25 mm diameter pellets 25 mm tall and sintered these under vacuum at temperatures between 1173 and 1673 K (900 and 1400° C.). The result are very strong pellets with exceptionally low thermal conductivity, as low as 0.39 W/mK for the smaller D 50 and in the range of 9 W/mK for the larger particles.

So we can expect that the surface area contact between the particles will be increased by the elastic or plastic response of the silicon to the pressing process and from the formation of the meniscus formed between the particles through the glassy behavior of the surface of the silicon during the sintering process.

One of the concerns that must be addressed in the engineering development of the process engineering is the management of the particle size distribution of the milled nano-sized silicon—with a fairly large fraction of fines below 100 nanometers and the question rises as to how these fines will behave.

Given the particles show morphology trending more towards equiaxed particles than perfectly spherical particles as the D 50 descends, we believe we will have a contact area between the particles substantially larger than the ¼₀th of the diameter one would expect in the perfect Hertzian arrangement of perfect spheres, perhaps ½₀th of the diameter.

The electron requires a pathway of about 4-6 nm, while the phonon requires a pathway of about 230 to 300 nm. If we aim for a D 50 of about 400 nm to a micron or more, we can expect the lower end of the contact areas could be as low as ½₀th of 40 nm to about 60 nm. A contact area of 2 nm is too small and will interfere with electrical conductivity while 60 nm is in the sweet spot for interfering with thermal conductivity.

In this case it is expected that fines below 30 nm or so will melt and migrate to the contact areas between the particles through capillary forces, thereby increasing the footprint of the menisci between the particles. This we believe is a bit of serendipity as we can now include the fines in the mix without the need for expensive and probably very tedious particle size sieving of such small particles, since the increase in the size of the menisci will be much larger proportionately in the smaller menisci, where we need larger increase to assure electrical conductivity and smaller on the larger ones where we have much larger scope for increase. If this serendipity is not in play we may have to resort to particle size management through milling controls or sifting by various means.

We want to assure that electricity flows with minimal resistance from grain to grain, and we want to stay outside of the quantum size effect for the electron in the physicality of the structure. In this case we want to deal with classical and well understood electrical conductivity dynamics in the physical world, contact resistance to be avoided and staying in the domain of Ohms Law.

We also want to operate, as it were, outside of Ohms Law as to the phonon, in effect using the quantum size effect to preclude the phonon traveling from grain to grain.

Contact resistance can be said to be a function of the contact surface roughness that causes submicron contacts, which are inimical to the objectives of the present general inventive concept. The better the surface finish the lower the contact resistance; the closer the contact area to the volume or cross section of the quantum size the lower the resistance. Resistance within a uniform cross section is proportional to its resistivity and length; it is inversely proportional to its cross-sectional area, which means a small area in contact with surface roughness can have very high resistivity.

In various example embodiments of the present general inventive concept, the cross-sectional area of the constituent particles is 200 to 800 nanometers, leading to contact areas in the range of 20 to 150 nanometers. Voltage is less than 900 microvolts, and at that point minimal contact resistance can be achieved if the contact areas are melted and do not oxidize.

It is feasible to think of resistance like a kind of mechanical friction, and a contact with surface roughness would be good to avoid.

Many embodiments of the present general inventive concept avoid contact resistance due to the physical imperfections of the contact faces by "melting," in effect "fusing" the contact areas together, bringing crystalline silicon of each grain into continuous phase contact with each other.

But even in this case we must deal with the other element described in contact resistance, the size of the contact area and here we begin to cross the Classical Limit as this is best explained not just by a physical feature of the physical parts but by the quantum size effect. The melting of the silicon at the contact area and the sizes required in this case are the same for the electron for contact resistance and for quantum size effect to block the electron, and the same also for the phonon. When the size of the structures are of similar or smaller scale as the Fermi wavelength of the electron or other quanta, Ohm's law will not apply. In this case we experience quantum size effects through quantum confinement such as 1D geometries as in nanowires and open dimensions such as quantum dots. The sizes of these as they relate to the Fermi wavelength can provide insight into the interaction of the quanta in nanostructures such as we are constructing. But in this case the speed of the quanta is of course different in the case of the electron or photon, light or phonon, heat, which changes the domain of wavelength and frequency.

Turning now to the figures, FIG. 1 is a flow diagram illustrating an example embodiment of the present invention. A method or process 10 for fabricating a doped silicon-based thermoelectric material begins by milling electronic-grade silicon into nano-sized grains or particulates 20, which are doped 30 with a dopant to create a material with the desired high electrical conductivity and other desired physical properties. The doped silicon material is mechanically fractured 40 in a controlled process to preclude oxidation and contamination. The doped nano-sized grains are then pressed into a preform 50 and then sintered 60 at a temperature below the melting point of bulk silicon but above the temperature where the glassy state evolves and surface melting causes a fusion or melting together, in effect fusing or bonding the crystalline structures together. The process or method creates a porous structure In some embodiments, the addition of ceramic pellets (zirconia pellets, for example, but silicon nitride is preferred to minimize harmful contamination) to the attrition mill has been found useful in accelerating the milling 20 of the silicon particulates.

In many embodiments, whether the final product is better suited to act as an N-type element or P-type element in a thermoelectric device is determined by the specific dopant 30 mixed with the silicon grains or particulates.

In various embodiments, a number of dopants are used to give the final thermoelectric material desired thermal, electrical, and mechanical properties. In some embodiments, dopants include one or more of the following: selenium, tellurium, germanium, tungsten, boron, phosphorus, and arsenic. In some embodiments, the formation of a planar or complexly shaped thermoelectric device includes a process in which one side is fabricated with silicon doped to be an N-type semiconductor and the second side is fabricated with silicon doped to be a P-type semiconductor. In some embodiments, a planar or complexly shaped thermoelectric device includes a first, thick side that is fabricated with silicon doped to be an N-type semiconductor and the second, thin side that is fabricated with silicon doped to be a P-type semiconductor. In some embodiments, a planar or complexly shaped thermoelectric device includes a first, thick side that is fabricated with silicon doped to be an P-type semiconductor and the second, thin side that is fabricated with silicon doped to be a N-type semiconductor. In some embodiments, the thin side of a thermoelectric device comprises a thin film. In some embodiments the P-type and N-type powders can be loaded into a dry press tool such that one side of the pressed pellet is an N-type semiconductor and the other is a P-type semiconductor.

For P-type semiconductor materials, the dopant often includes boron, aluminum, gallium, or generally a Group III element, or a combination of Group III elements.

For N-type semiconductor materials, the dopant often includes phosphorus, arsenic, or generally a Group V element, or a combination of Group V elements.

In several embodiments, one of the final phases of the fabrication process involves sintering the material into a polycrystalline form and shape with controlled porosity and density. The sintering process comprises a solid-state diffusional process in which adjacent grains and particulates bond at a homologous temperature of approximately 1375° C. In several embodiments, a number of methods are used to shape a mixture of milled and doped silicon particulates into a green body for sintering. In various embodiments, the mixture is extruded, injection molded, die-pressed, isostatically pressed or slip cast to produce a green body of desired shape. Sintering of the green body is carried out in an atmosphere that is substantially inert, for example, argon, helium, or a vacuum. In various embodiments, the sintering atmosphere ranges from a substantial vacuum to atmospheric pressure. Sintering is carried out at a temperature ranging from 1000° C. to approximately 1414° C. Generally, sintering temperature is at least 1150° C., and in many embodiments at least 1250° C., to increase the rate of solid state sintering. The particular sintering temperature is determinable empirically and depends largely on particle size, amount of dopant, density of the green body, and final density desired in the sintered thermoelectric material, with higher final densities requiring higher sintering temperatures. Generally, the smaller the size of the milled silicon particulates in the green body, and the higher its density, the lower is the required sintering temperature. In most embodiments, sintering is carried out at a temperature below the melting point of silicon, in order to preserve the reticulated porosity of the polycrystalline structure. One must consider that the level of doping will affect the melting point of the silicon and thus the sintering temperature. One of ordinary skill in the arts addressed here will see that one wants to sinter at a temperature below the transition from solidus to liquidus and make a very good fused bond between the grains.

In a thermoelectric material fabricated according to a method such as one of the disclosed example embodiments, the porosity of the fabricated structure is reticulated. When the milled and doped silicon particulates are sintered, for example as described above, the final polycrystalline product generally exhibits a porosity of at least 20%, and often between 20% and 45%. In some embodiments, the final polycrystalline product generally exhibits a porosity of between 25% and 45%. In some embodiments, the final polycrystalline product generally exhibits a porosity of approximately 35%. The porosity of the sintered polycrystalline thermoelectric material contributes to the low density of the material, and the low density of the material gives the material a lower thermal conductivity than many competing semiconductive products. In some embodiments, the final polycrystalline product exhibits a thermal conductivity in the range of 0.1 to 12 Watts per meter Kelvin. Further, it is possible to infiltrate the porous thermoelectric structure with a variety of materials to modify the thermal conductivity, electrical conductivity, and Seebeck Coefficient of the fabricated thermoelectric structure. For example, in some embodiments, reticulated porous spaces in the polycrystalline thermoelectric material are infiltrated with ethyl silicate or colloidal silica (two example substances with low thermal conductivity and low coefficients of thermal expansion). In other cases it can be filled with a material which is electrically conductive.

In several example embodiments, the final product is a silicon-based thermoelectric material comprising a heterogeneous mixture of silicon particulates, substantially free of oxidants, with a dopant added to affect the semiconductive properties of the thermoelectric material, the heterogeneous mixture having been sintered to form a polycrystalline silicon-based thermoelectric material. In some example embodiments, the thermoelectric material includes at least two layers having different thermoelectric properties.

Figure 2:
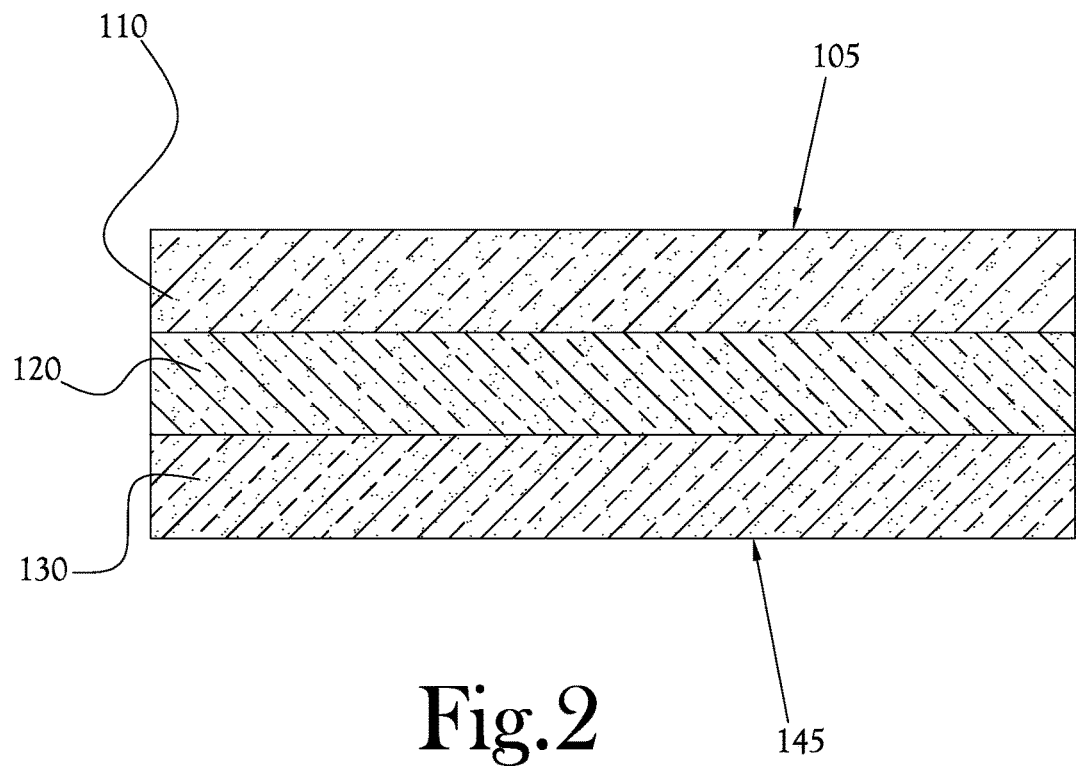
FIG. 2 is a sectional view of an example embodiment of a silicon-based thermoelectric device in which several layers of doped silicon-based thermoelectric material are combined.

In some example embodiments, a thermoelectric device comprises multiple layers of silicon-based thermoelectric materials, with each layer having at least a slightly different material composition and therefore having a different thermal conductivity, electrical conductivity, or Seebeck Coefficient from an adjacent layer. FIG. 2 illustrates one example embodiment of a multi-layer thermoelectric device. As shown in FIG. 2, a thermoelectric device 101 comprises three layers, including a top layer 110, a middle layer 120, and a bottom layer 130; the three layers combine to form a laminate body with an upper face 105 and a lower face 145. In the illustrated example embodiment, each of the three layers contains a different combination of milled silicon particulates and dopant. In the illustrated example embodiment, all layers contain the same dopant, but the layers differ in that the top layer 110 contains the lowest concentration of dopant (or, alternatively, the lowest amount of dopant as a weight percentage of the total heterogeneous mixture in the top layer 110); the middle layer 120 contains a slightly higher concentration of dopant than the top layer 110; and the bottom layer contains the highest concentration of dopant of all the three layers. As a result of the differing concentrations of dopant, each layer has slightly different semiconductive and thermoelectric properties. In the illustrated example embodiment, the top layer 110 has less thermal and electrical conductivity than the layers below it. Therefore, in one use of the illustrated example embodiment multilayer thermoelectric device, the upper face 105 of the device 101 faces a heat source, and the lower face 145 of the device 101 faces the cold side of the thermal gradient; having the top layer 110, with its relatively low thermal conductivity, facing the heat source protects the structural integrity of the device 101 and helps to maintain the temperature gradient across the cross-section of the device 101. At the same time, the other layers 120 and 130, with their greater electrical conductivity, are well equipped to take advantage of the electron flow through the top layer 110. Those of skill in the art will recognize that other uses for multi-layer thermoelectric devices are possible and are contemplated by the present invention.

In some alternative example embodiments that comprise thermoelectric device with multiple layers of polycrystalline silicon-based thermoelectric materials, the layers differ in that each layer comprises a different dopant or a different combination or ratio of dopants. For example, in an example embodiment, a three-layer thermoelectric device includes one layer in which the principal dopant includes selenium; one layer in which the principal dopant includes tellurium; and one layer in which the principal dopant includes tungsten. As a result of the dopant differences, each layer has different semiconductive and thermoelectric properties.

In some alternative example embodiments that comprise thermoelectric device with multiple layers of polycrystalline silicon-based thermoelectric materials, the layers differ in that the density of each layer is different from the density of other layers in the device. As a result of the density differences, each layer has different semiconductive and thermoelectric properties.

In some of the several embodiments, the present invention allows for the fabrication of planar, net-shaped, or complexly shaped thermoelectric devices that are capable of being installed in a variety of places, and in particular are capable of being installed in places to absorb waste heat from machinery or equipment and transform the waste heat into electricity. For example, thermoelectric devices according to some of the example embodiments of the present invention are capable of being wrapped around pipes in some industrial settings, absorbing heat from the pipe.

The methods and processes disclosed above are useful for producing highly efficient silicon-based thermoelectric materials that have high Seebeck Coefficients, high electrical conductivity, and low thermal conductivity, with the precise parameters of each silicon-based thermoelectric material dependent upon the nature of the dopant, the particle size of the milled silicon particulates, and the density of the final sintered polycrystalline thermoelectric material. Such thermoelectric materials are susceptible to being worked to construct planar and complex net-shaped objects that can be fitted into locations where they may be used to recover waste heat. Such thermoelectric materials have cross sections with properties to maintain an adequate temperature differential between the two opposing sides in order to generate voltage efficiently. These silicon-based thermoelectric materials generally have larger cross sections than many competing thermoelectric and semiconductor materials. The larger cross section of such silicon-based thermoelectric materials is useful for maintaining a temperature gradient. Doped silicon-based thermoelectric material have high tensile strength, have resistance to thermal shock, and are formable into layers and curved and other shapes to allow the creation of graded indices for electrical, thermal, or other parameters. These silicon-based thermoelectric materials are useful in a number of contexts, and it is feasible to use them to efficiently recover heat over a large range of temperatures. In some embodiments, silicon-based thermoelectric materials are able to efficiently recover heat within a range of −65° C. to 1100° C.

Moreover, while the example embodiments described above have generally involved silicon grains or particulates doped with another material, it is not the intention of the present application to limit the general inventive concept to silicon-based materials. A number of semiconductor materials are encompassed by the present general inventive concept, including, without limitation: germanium, diamond, silicon carbide, silicon germanium; gallium arsenide, gallium nitride, aluminum arsenide, aluminum phosphide; tetrahedrites, bismuth telluride, skutterudites.

As with silicon-based doped thermoelectric materials, other doped thermoelectric materials often employ one or more specific dopants to achieve desired electrical, thermal, or mechanical properties, including specific dopants to create N-type and P-type semiconductors. Thus, for example, for gallium arsenide, N-type dopants include tellurium, sulphur (substituting As), tin, silicon, germanium (substituting Ga); and P-type dopants include zinc, chromium (substituting Ga), silicon, germanium (substituting As). For gallium phosphide, N-type dopants include tellurium, selenium, sulphur (substituting phosphorus); and P-type dopants include zinc, magnesium (substituting Ga), tin (substituting P). For cadmium telluride, N-type dopants include indium, aluminum (substituting Cd), chlorine (substituting Te); and P-type dopants include phosphorus (substituting Te), lithium, sodium (substituting Cd). For cadmium sulfide, N-type dopants include gallium (substituting Cd), iodine, fluorine (substituting S); and P-type dopants include lithium, sodium (substituting Cd).

As a general matter, for a number of semiconductor materials, N-type dopants include phosphorus, arsenic, antimony, bismuth, and lithium. Phosphorus diffuses quickly, so is usually used for bulk doping, or for well formation. Used in solar cells. Can be added by diffusion of phosphine gas. Bulk doping can be achieved by nuclear transmutation, by irradiation of pure silicon with neutrons in a nuclear reactor. Phosphorus also traps gold atoms, which otherwise quickly diffuse through silicon and act as recombination centers. Arsenic's slower diffusion allows using it for diffused junctions. Used for buried layers. Has similar atomic radius to silicon, high concentrations can be achieved. Its diffusivity is about a tenth of phosphorus or boron, so is used where the dopant should stay in place during subsequent thermal processing. Useful for shallow diffusions where well-controlled abrupt boundary is desired. Preferred dopant in VLSI circuits. Preferred dopant in low resistivity ranges. Antimony is a n-type dopant. It has a small diffusion coefficient. Used for buried layers. Has diffusivity similar to arsenic, is used as its alternative. Its diffusion is virtually purely substitutional, with no interstitials, so it is free of anomalous effects. For this superior property, it is sometimes used in VLSI instead of arsenic. Heavy doping with antimony is important for power devices. Heavily antimony-doped silicon has lower concentration of oxygen impurities; minimal autodoping effects make it suitable for epitaxial substrates. Bismuth is a dopant for long-wavelength infrared photoconduction silicon detectors, a viable n-type alternative to the p-type gallium-doped material. Lithium is used for doping silicon for radiation hardened solar cells. The lithium presence anneals defects in the lattice produced by protons and neutrons. Lithium can be introduced to boron-doped p+ silicon, in amounts low enough to maintain the p character of the material, or in large enough amount to counterdope it to low-resistivity n type.

As a general matter, for a number of semiconductor materials, P-type dopants include boron, aluminum, nitrogen, gallium, and indium. Boron's diffusion rate allows easy control of junction depths, and boron can be added by diffusion of diborane gas. As a rule, it is the only acceptor with sufficient solubility for efficient emitters in transistors and other applications requiring extremely high dopant concentrations. It diffuses about as fast as phosphorus. Aluminum is used for deep P-diffusions (and is also a common unintentional impurity). Nitrogen is important for growing defect-free silicon crystal; it improves mechanical strength of the lattice, increases bulk microdefect generation, suppresses vacancy agglomeration. Gallium is a dopant used for long-wavelength infrared photoconduction silicon detectors in the 8-14 μm atmospheric window. Gallium-doped silicon is also promising for solar cells, due to its long minority carrier lifetime with no lifetime degradation; as such it is gaining importance as a replacement of boron doped substrates for solar cell applications. Indium is a dopant used for long-wavelength infrared photoconduction silicon detectors in the 3-5 μm atmospheric window.

As a general matter, for the Group III-V semiconductors, selenium, tellurium, silicon and germanium are common N-type dopants, and beryllium, zinc, silicon and germanium cadmium are common P-type dopants.

Moreover, as a general matter, dopants that are used in various embodiments of the present general inventive concept include germanium, silicon, xenon, gold, and platinum.

Thermoelectric materials fabricated according to some of the several embodiments of the present general inventive concept maintain good Seebeck Coefficient while getting high values for electrical conductivity. In some embodiments, employing larger atoms for doping, such as arsenic, particularly on the N leg, allows less mobility within the material and enhances the usefulness of the material in high temperature operations. Additionally, in some embodiments, larger legs can take advantage of space, time and velocity to realize more efficient operation and higher unaided Delta T. The advantages of some example materials according to the present general inventive concept, as over selected semiconductor materials of the prior art, are summarized in Table 1.

TABLE 1

| Material | CTE (ppm) | Operating Temp. (Kelvins) | Seebeck (mV) (lower) | Seebeck (mV) (upper) | Elec. (Siemens) (lower) | Elec. (Siemens) (upper) |
|---|---|---|---|---|---|---|
| $Bi_2Te_3$ & family | 18 | 550 | 0.00008 | 0.00014 | 50000 | 80000 |
| Oxides | 8 | 900 | 0.00008 | 0.00012 | 12000 | 18000 |
| Lead Telluride | 16 | 400 | 0.00014 | 0.00018 | 20000 | 30000 |
| Half Heusler | 16 | 600 | 0.00012 | 0.00018 | 40000 | 80000 |
| Skutterudites | 16 | 750 | 0.00012 | 0.00018 | 40000 | 80000 |
| ZNTL | 12 | 700 | 0.00012 | 0.00018 | 40000 | 80000 |
| LAST | 14 | 700 | 0.00014 | 0.00018 | 20000 | 30000 |
| Magnesium Silicide | 11.5 | 700 | 240 | 300 | 6000 | 32000 |

| Material | Thermal (W/mK) (upper) | Thermal (W/mK) (lower) | ZT (lower) | ZT (upper) | Rare Earth/ Precious? | Cost | Temp. Stable? | Large X-Section? |
|---|---|---|---|---|---|---|---|---|
| $Bi_2Te_3$ & family | 2.5 | 1.5 | 0.0704 | 0.57493 | Yes | High | No | <1 mm |
| Oxides | 3 | 2 | 0.02304 | 0.11664 | ? | High | Yes | <1 mm |
| Lead Telluride | 3 | 1.5 | 0.05227 | 0.2592 | Yes | High | No | <1 mm |
| Half Heusler | 2.5 | 1.5 | 0.13824 | 1.0368 | Yes | High | No | <1 mm |
| Skutterudites | 10 | 1.5 | 0.0432 | 1.296 | Yes | High | No | <1 mm |
| ZNTL | 2.5 | 1.5 | 0.16128 | 1.2096 | Yes | High | no | <1 mm |
| LAST | 0.8 | 0.5 | 0.343 | 1.3608 | Yes | High | No | <1 mm |
| Mg. Silicide | 6 | 3.6 | 0.3 | 0.8 | No | Mod. | No | Thin |

| Material | CTE (ppm) | Operating Temp. (Kelvins) | Seebeck (mV) (lower) | Seebeck (mV) (upper) | Elec. (Siemens) (lower) | Elec. (Siemens) (upper) |
|---|---|---|---|---|---|---|
| Micro Channels | 3.6 | 900 | 0.00012 | 0.00018 | 25000 | 35000 |
| Nano Fiber | 3.6 | 900 | 0.00012 | 0.00018 | 25000 | 35000 |
| Silicon Germanium | 4 | 1400 | 0.00014 | 0.00028 | 20000 | 40000 |
| Porous Silicon | 3.6 | 1400 | 0.00017 | 0.00024 | 25000 | 50000 |

| Material | Thermal (W/mK) (upper) | Thermal (W/mK) (lower) | ZT (lower) | ZT (upper) | Rare Earth/ Precious? | Cost | Temp. Stable? | Large X-Section? |
|---|---|---|---|---|---|---|---|---|
| Micro Channels | 1.5 | 0.6 | 0.216 | 1.701 | No | High | Yes | <1 mm |
| Nano Fiber | 1.5 | 0.6 | 0.216 | 1.701 | No | High | Yes | <1 mm |
| Si Germanium | 60 | 2.5 | 0.00915 | 1.75616 | Yes (Ge) | High | Yes | 10+ |
| Porous Silicon | 1 | 0.6 | 1.0115 | 6.72 | No | Low | Yes | 25+ |

In some embodiments, silicon-based thermoelectric materials fabricated according to some of the several embodiments of the present general inventive concept provide increased Seebeck Coefficient, high electrical conductivity and low thermal conductivity. Silicon has the advantage of a low CTE (less than 4 ppm) and low cost. Silicon pellets can be made economically in large cross sections, supporting large unaided Delta T. Industrial milling facilitates the fabrication of porous structures instead of bulk hot pressed structures, thus providing a finished product with a lower thermal conductivity.

Further, in several example embodiments, the use of nano-structuring allows practitioners to obtain very low thermal conductivity in the finished product. The construction of a porous nano-structure of oxygen-free doped silicon also provides for a material with low thermal conductivity. Doping the material with boron adds low electrical resistivity. The result is a thermoelectric material with a high Seebeck Coefficient, optimized electrical conductivity, and low thermal conductivity. In some embodiments, it is possible to engineer a material with thermal conductivity of less than 1 W/MK using nanostructures. It is further possible to dope for low electrical resistivity, using boron for example. In some embodiments, the material is "overdoped" with boron to achieve desired properties. In some embodiments, the doping also includes such materials as phosphorous or arsenic.

Smaller particles will of course suffer stresses farther below the limits of the modulus as a function of their size, so smaller size is preferable for enduring many cycles without mechanical failure. It is a feature in the present design that very small particles are bonded together below the melting point of silicon and that the smaller particles will impart a smaller stress on those bonded joints.

In this case the fact of an ability to create a large economical throughput of nano-sized slightly angular silicon also provides the ability to make desired large shapes in porous silicon is in contrast to all the prior art listed above which lacks the ability to make large economical strong form factors.

The best source of silicon for this application is a very pure silicon manufactured from the "Siemens" process. In this case, metallurgical silicon is processed into a chemical precursor so that it can be purified by distillation before deposition into an ingot or boule through CVD. This material can be "doped" with elements, for instance from column III of the periodic chart, for example boron, or column V, for example phosphorous and arsenic are common. In this way electrical conductivity and other semiconductor behaviors can be tailored. However, one with ordinary skill in the art will understand and anticipate that our approach can be applied to a large list of thermoelectric materials. Namely that nano sizing in our milling and pressing and sintering as described herein will provide large benefits to all thermoelectric materials.

It is important to note that there is a well-studied quantum size effect being considered in the realm of thermoelectric devices wherein it is now understood that a structure where the contacts paths with dimensions less than 5 nanometers will not conduct electricity very well and less than 200 nanometers will not conduct phonons very well. Therefor when making a porous nanostructure, if one desires high electrical conductivity in the silicon structure itself, one will tailor the starting grains pressed into the preforms to avoid creating contact points less than five nanometers, or make other arrangements for electrical conductivity, for example through addition of graphite, silicon carbide or other complex matrix constituents.

Silicon has a well-known "glassy state" far below the melting point, which is designated by most resources at 1414 to 1417 degrees centigrade. It is questionable if the actual melting point of silicon is known since most all evaluations are done in quartz crucibles which bring oxygen into the melt in the form of silicon monoxide. For instance clean un-oxidized nano particles of silicon, usually cleaned of the oxide mono native layer with hydrogen fluoride, has been reported to melt at temperatures well below one thousand degrees centigrade.

The surface chemistry of silicon has long been recognized for having a glassy state, and speculation as to its nature often includes reference to the "native oxide" layer normally found on the surface of silicon. Andy Grove while at Fairchild performed and reported some of the seminal work in this regard with respect to semiconductor device design and processing.

One of the long unmet needs with regard to nano-sized or even micron sized silicon is a safe inexpensive process for taking silicon grains of a larger size, one to several mm or larger, and diminishing the size to microns or nanometers free of oxidation, which means maintaining its reactivity and making the downsizing safe.

If we assume a perfect Hertzian contact area between two equally-sized spheres we might expect a contact area of 1/40th of the diameter. In such a case we would want a maximum of perhaps 150 nm to preclude phonon transmission, and a minimum of about 5 μm to ensure electron transmission. To achieve this we would want a particle size distribution of the grains to be pressed to cut off at about 3 μm, so as to limit the largest contact areas to about a hundred nm.

It is possible to sinter at relatively low temperatures, perhaps not 1623 K (1350° C.) but as low as 1173 K (700° C.). However, the higher temperature in fused silica results in a higher STens, because of the larger meniscus formed. One can expect that the same phenomena will be in play with the sintered porous rebonded silicon, so the higher temperature may still be desired.

While the surfaces of our particles are probably elongated semi ellipsoid shapes, and irregular, our SEM and micrograph work shows they increasingly equiaxed as they are milled to D 50 size in the several hundred nanometer size. We can expect surfaces with some irregularities. However, these defects will be exceptionally small and we can expect that the glassy formation of the meniscus will cure these defects and create a larger more perfect bond between the materials. We will be pressing the powder extracted from the slurry with some great pressure, and this will cause deformation and increase the contact area.

At the same time as we will be sintering in the range of 1173-1623 K (900 to 1350° C.). In this range we can expect to form the "glassy" state of the surface of the silicon, which in the vacuum will result in the contact area collecting a mass and resulting in a meniscus increasing the contact area. According to the reports by the investigators at Innovalight, we can expect the smallest particles to be absorbed in the glass state. The size of the meniscus will be a function of the surface area, viscosity, surface energy and temperature of course. So this means that we can expect that the surface area will increase in this respect.

In this case we can expect that we will be able to mill silicon to a D 50 of one micron or less, press it into a large pellet, perhaps 25 mm diameter and 25 mm thick, sinter it in a vacuum of about 0.2 microns in the range of 1173 and 1673° K (900 to 1400° C.) and have contact areas between the milled grains larger than 5 nm and smaller than 200 nm, resulting in thermal conductivity in the range of 0.5 W/mK and very low stresses on the meniscus as the structure expands and contracts in each cycle.

This silicon is milled in a protected cover to preclude oxygen. Ethanol is a preferred cover since it protects from oxygen and can be economically recycled.

In the case of the silicon, it can be doped with materials from column III or V, such as boron, phosphorous, arsenic and others to electrical conductivity as high as 109,000 Siemens, as can be silicon carbide.

Silica ($SiO_2$) and graphite (C) can also be added as sintering aids to provide a stronger bonding among the nano particles in the sintering process. In terms of adding sintering aids to create other phases in the physical matrix, the family of oxides, nitrides and carbides are well known to one skilled in the ceramic fabrication arts. For instance, yttrium oxide, aluminum oxide, silicon oxide, and zirconium oxide are all well-known sintering aids in the fabrication of silicon nitride, which can be of value in this approach. The object of this teaching is to give examples of a novel way of adding proscribed amounts of sintering aids to the milling of the silicon at some point to create the desired precursors for fabrication of structures in the matrix of value to the objects of the present general inventive concept.

Once the material(s) are properly milled such that about 95% of the particles are below a minimum, 800 nanometers has been achieved and is suggested as optimal, they must be formed into a preform, but optimally without a binder.

In such a case applying a lubricant, ethanol is again considered ideal among others as practioners in the operation of vacuum furnaces are comfortable evacuating ethanol, to the powders in a pressing tool will enable the powders to organize themselves under pressure into a structure that will retain significant binderless preform structure. Pressing should be done at 100-900 MPa, and it is suggested that about 450-750 MPa is optimal. It is suggested that a tapered die will provide the best process efficiency and yield for exit of the pressed preform in the absence of binders or other lubricants.

Once these preforms are completed and ready to sintered it is best that the object is then sintered in a vacuum furnace. Optimally argon is back filled and evacuated one or more times to remove oxygen from the atmosphere, and oxygen liberated at various temperatures from constituents in the furnace. Temperatures of 300 and 700 degrees Celsius are suggested as good points for purging with argon and returning to the suggested vacuum at the level of 0.2 microns, or minus 5 or 6 torr. The sintering temperature will depend upon a number of factors, including the mix of carbon, silica, silicon and silicon carbide. One would find that 950 to 1400 Celsius will provide the range of temperature required.

In some embodiments of the present general inventive concept, a process for fabricating a doped thermoelectric material encompasses mixing particulates of a semiconductor base material with a dopant; milling the semiconductor base material particulates containing the dopant so that said particulates have a median size of less than 3,000 nanometers and are substantially equiaxed; and sintering said particulates containing the dopant in an atmosphere essentially free of oxygen to form a doped thermoelectric material.

In some embodiments, said semiconductor base material includes a material selected from the group consisting of silicon, germanium, diamond, silicon carbide, silicon germanium, gallium arsenide, gallium nitride, gallium phosphide, aluminum arsenide, aluminum phosphide, cadmium telluride, cadmium sulfide, bismuth telluride, tetrahedrites, and skutterudites.

In some embodiments, said thermoelectric material is a P-type semiconductor and said dopant includes boron, aluminum, gallium, or a similar P-type dopant.

In some embodiments, said thermoelectric material is an N-type semiconductor and said dopant includes phosphorus, arsenic, or a similar N-type dopant.

In some embodiments, said dopant includes germanium or a similar material to improve the thermal, electrical, or mechanical properties of the thermoelectric material.

In some embodiments, said dopant includes an element selected from the group consisting of selenium, tellurium, germanium, tungsten, boron, phosphorus, and arsenic.

In some embodiments, said sintering is carried out in an inert atmosphere.

In some embodiments, said sintering is carried out under reduced pressure.

In some embodiments, said sintering is carried out at a temperature of between 1000 degrees Celsius and 1414 degrees Celsius.

In some embodiments of the present general inventive concept, a doped silicon-based thermoelectric material includes milled silicon grain particles having a median particle size of less than 3,000 nanometers, said milled silicon particles being substantially equiaxed, and a dopant mixed with milled silicon particles to form a doped silicon-containing material, said dopant reducing the thermal conductivity of the doped silicon-containing material compared to the milled silicon grain particles, said doped silicon-containing material being sintered in the absence of oxidants to form a doped silicon-based thermoelectric material.

In some embodiments, said doped silicon-based thermoelectric material is a P-type semiconductor and said dopant includes boron, aluminum, gallium, or a similar P-type dopant.

In some embodiments, said doped silicon-based thermoelectric material is an N-type semiconductor and said dopant includes phosphorus, arsenic, or a similar N-type dopant.

In some embodiments, said dopant includes germanium or a similar material to improve the thermal, electrical, or mechanical properties of the doped silicon-based thermoelectric material.

In some embodiments, said sintering is carried out under reduced pressure.

In some embodiments, a method for fabricating a doped silicon-based thermoelectric material includes introducing a first quantity of silicon particulates into an attrition mill in the absence of oxidants, admixing the first quantity of silicon particulates with a dopant to affect the semiconductive properties of the thermoelectric material, subjecting said first quantity of silicon particulates combined with dopant to attrition in the attrition mill for a time sufficient to reduce at least a portion of said silicon particulates to a preselected average particle size to produce a second quantity of reduced particle size doped silicon particulates being essentially oxidant free, said second quantity of reduced particle size doped silicon particulates having a median size of less than 3,000 nanometers, said second quantity of reduced particle size doped silicon particulates having substantially equiaxed grain particles, withdrawing from said attrition mill at least a portion of said second quantity of reduced particle size doped silicon particulates, fracturing the doped silicon particulates in the absence of oxidants; pressing the doped silicon particulates into a preform; and sintering doped silicon particulates in the absence of oxidants to form a doped silicon-based thermoelectric material.

In some embodiments, said doped silicon-based thermoelectric material is a P-type semiconductor and said dopant includes boron, aluminum, gallium, or a similar P-type dopant.

In some embodiments, said doped silicon-based thermoelectric material is an N-type semiconductor and said dopant includes phosphorus, arsenic, or a similar N-type dopant.

In some embodiments, said dopant includes germanium or a similar material to improve the thermal, electrical, or mechanical properties of the doped silicon-based thermoelectric material.

In some embodiments, said dopant includes an element selected from the group consisting of selenium, tellurium, germanium, tungsten, boron, phosphorus, and arsenic. In some embodiments, said sintering is carried out under reduced pressure.

While the present invention has been illustrated by description of several embodiments and while the illustrative embodiments have been described in considerable detail, it is not the intention of the applicant to restrict or in any way limit the scope of the appended claims to such detail. Additional advantages and modifications will readily appear to those skilled in the art. The invention in its broader aspects is therefore not limited to the specific details, representative apparatus and methods, and illustrative examples shown and described. Accordingly, departures may be made from such details without departing from the spirit or scope of applicant's general inventive concept.

What is claimed is:

1. A process for fabricating a doped thermoelectric material comprising:
   mixing particulates of silicon with germanium and a dopant in ethanol and ethyl silicate in an attrition mill in the absence of oxidants;
   milling the silicon and the dopant until the silicon particulates have a median size of less than 3,000 nanometers to form a mixture consisting essentially of silicon, ethyl silicate, germanium, the dopant, and ethanol
      where the silicon particulates are substantially equiaxed, and
      where the dopant is selected from the group consisting of selenium, tellurium, tungsten, boron, aluminum, gallium, phosphorus, arsenic, and combinations thereof;
   purging the mixture under argon gas at a temperature from 300 to 700 degrees Celsius;
   pressing the mixture into a preform; and
   sintering the preform in an atmosphere essentially free of oxygen from 900 to 1414 degrees Celsius to fabricate the doped thermoelectric material.

2. The process of claim 1, where the dopant is selected from the group consisting of boron, aluminum, gallium, and combinations thereof.

3. The process of claim 1, where the dopant is selected from the group consisting of phosphorus, arsenic, and combinations thereof.

4. The process of claim 1 wherein said sintering is carried out in an inert atmosphere.

5. The process of claim 1, where the sintering is carried out from minus 5 to 6 Torr.

6. The process of claim 1, where after milling, the silicon particulates have a diameter from 200 to 800 nm and contact areas from 20 to 150 nm.

7. The process of claim 1, where the sintered preform has a thermal conductivity from 0.1 to 12 Watts.

8. A process for fabricating a doped thermoelectric material comprising:
   mixing particulates of silicon with germanium and a dopant in ethanol and ethyl silicate in an attrition mill in the absence of oxidants;
   milling the silicon and the dopant until the silicon particulates have a median size of less than 3,000 nanometers to form a mixture consisting essentially of silicon, ethyl silicate, germanium, the dopant and ethanol,
      where the silicon particulates are substantially equiaxed, and
      where the dopant is selected from the group consisting of selenium, tellurium, tungsten, boron, aluminum, gallium, phosphorus, arsenic, and combinations thereof;
   purging the mixture under argon gas at a temperature from 300 to 700 degrees Celsius;
   pressing the mixture into a preform; and
   sintering the preform in an atmosphere essentially free of oxygen at least 1150 degrees Celsius to fabricate the doped thermoelectric material.

9. The process of claim 8, where the dopant is selected from the group consisting of boron, aluminum, gallium, and combinations thereof.

10. The process of claim 8, where the dopant is selected from the group consisting of phosphorus, arsenic, and combinations thereof.

11. The process of claim 8, where the sintering is carried out in an inert atmosphere.

12. The process of claim 8, where the sintering is carried out from minus 5 to 6 Torr.

13. The process of claim 8, where after milling, the silicon particulates have a diameter from 200 to 800 nm and contact areas from 20 to 150 nm.

14. The process of claim 8, where the sintered preform has a thermal conductivity from 0.1 to 12 Watts.

15. A process for fabricating a doped thermoelectric material comprising:
   mixing particulates of silicon with a dopant in ethanol and ethyl silicate in an attrition mill in the absence of oxidants;
   milling the silicon and the dopant until the silicon particulates have a median size of less than 3,000 nanometers to form a mixture consisting essentially of silicon, ethyl silicate, the dopant, and ethanol,
   where the silicon particulates are substantially equiaxed, and
   where the dopant is selected from the group consisting of selenium, tellurium, tungsten, boron, aluminum, gallium, phosphorus, arsenic, and combinations thereof;
   purging the mixture under argon gas at a temperature from 300 to 700 degrees Celsius;
   pressing the mixture into a preform; and
   sintering the preform in an atmosphere essentially free of oxygen at least 1150 degrees Celsius to fabricate the doped thermoelectric material.

16. The process of claim 15, where the dopant is selected from the group consisting of boron, aluminum, gallium, and combinations thereof.

17. The process of claim 15, where the dopant is selected from the group consisting of phosphorus, arsenic, and combinations thereof.

18. The process of claim 15, where the sintering is carried out in an inert atmosphere.

19. The process of claim 15, where after milling, the silicon particulates have a diameter from 200 to 800 nm and contact areas from 20 to 150 nm.

20. The process of claim 15, where the sintered preform has a thermal conductivity from 0.1 to 12 Watts.

* * * * *